Nov. 12, 1968
I. F. BARDITCH ETAL
3,411,099
AUTOMATIC GAIN AND FREQUENCY CONTROL SYSTEM
FOR SEMICONDUCTOR AMPLIFIER
Filed Dec. 21, 1965
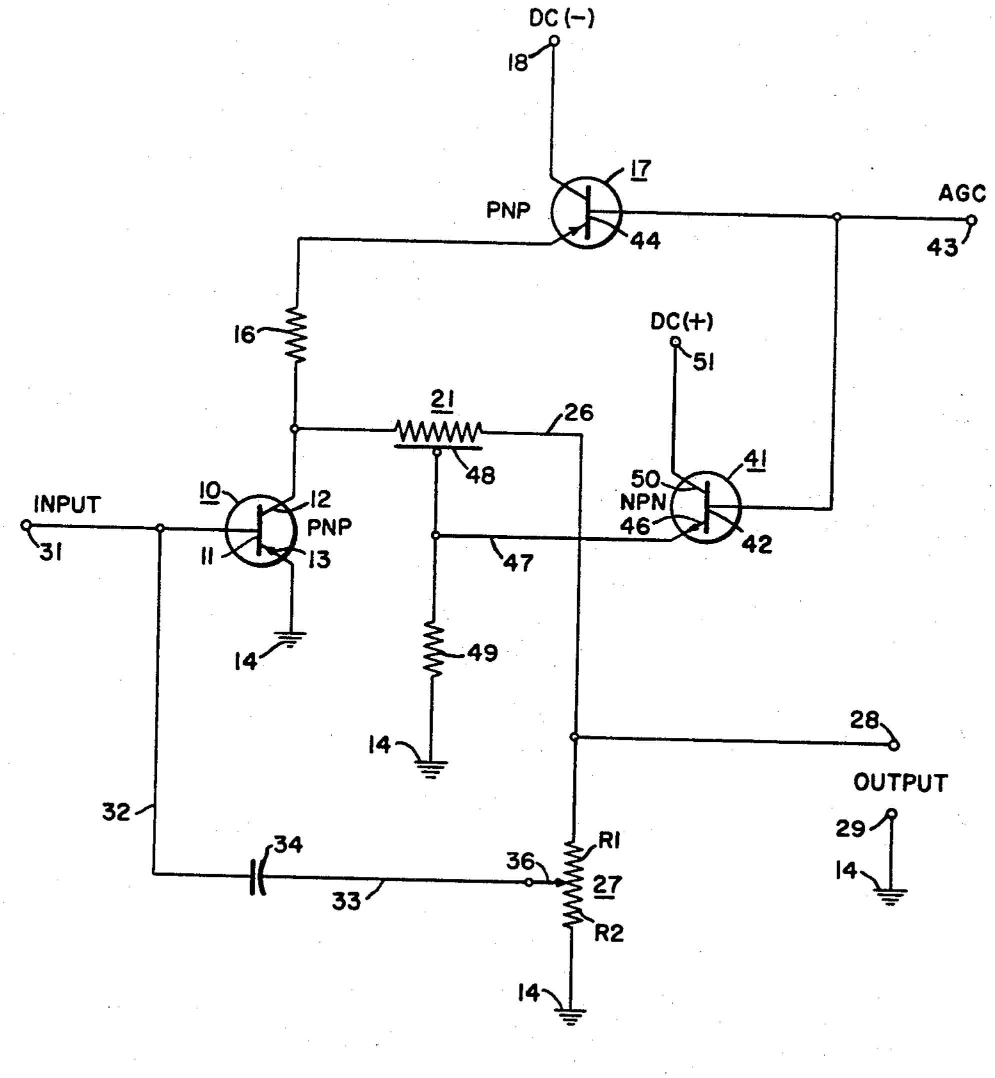
WITNESSES
Wm. B. Sellers
James F. Young
INVENTORS
Irving F. Barditch, Robert Bento
and Charles G. Brooks
BY
John L. Miegroffe
ATTORNEY 3,411,099
AUTOMATIC GAIN AND FREQUENCY CONTROL SYSTEM FOR SEMICONDUCTOR AMPLIFIER Irving F. Barditch, Baltimore, Md., Robert Bento, Tiverton, R. I., and Charles G. Brooks, Baltimore, Md., assignors to Westinghouse Electric Corporation, Pittsburgh, Pa., a corporation of Pennsylvania Filed Dec. 21, 1965, Ser. No. 515,374
4 Claims. (Cl. 330—26)

This invention relates to an AGC system for band-pass signal transmission systems using voltage tuned transistor devices instead of inductances.

The present invention is particularly directed to signal transmission systems in which band-pass characteristics are accomplished by the use of distributed RC networks in association with transistors both of which can be molecularized and therefore lend themselves to miniaturization. Such semi-conductor devices are voltage sensitive. Therefore, maintaining a constant level of gain through such devices by the use of AGC systems raises problems, both as regards the signal gain and the center frequency of the band-pass. By the very nature of these inductanceless band-pass amplifiers, which rely upon feedback in order to provide frequency selectivity, the conventional systems for providing AGC patrol cannot be utilized and a different approach is necessary.

Although it is common to refer to signals having single line frequency, in practice signal energy is carried in a spectrum, or band, of frequencies. Therefore, the output signal is the resultant of a plurality of signal vectors of various phases. To avoid LC tuned circuits in facilitating monolithic block fabrication, in accordance with this invention and others owned by the assignee of this application, tuned or band-pass circuits are provided by operatively associating a plurality of parallel frequency sensitive paths between the input and output tunnels through which the signal energy is propagated wherein shifting of the relative phase of the signals in the selected band is such that addition and cancellation takes place to provide the equivalent of tuned LC circuits.

In other pending patent applications, owned by the assignee of this application, there is disclosed and claimed tuned signal translation systems utilizing phase shifting RC networks associated with active devices having positive gain. These devices, unless carefully adjusted, have a tendency to become bilateral in nature. When such systems are cascaded this tendency increases. This places a limitation on the design of certain amplifiers, such as IF amplifiers, used in radar and television sets, because of the staggered band-pass tuning that is required.

The present invention provides a novel and improved combined isolation and AGC circuit configuration which can be used with such systems described in said copending applications in order to improve the operating characteristics and to avoid undesirable feedback and shifting of the center frequency of the band-pass while at the same time maintaining desired constant gain level. The present invention provides such an improved system in a very simple circuit configuration which can be fabricated completely within a monolithic block.

Accordingly, the primary object of the present invention is to provide a novel and improved band-pass translation system having an AGC system in which the center frequency is maintained when a variable AGC voltage is applied to vary the gain.

Another object is to provide a novel and improved AGC system which can be incorporated into the voltage tuned semi-conductor inductanceless band-pass amplifiers and which will maintain the center frequency while permitting voltage changes to vary the gain of the system.

Another object is to provide a novel and improved band-pass signal translation system having means for compensating against voltage changes necessary for automatic gain control while maintaining the center frequency at a substantially constant value.

The invention itself, however, both as to its organization and method of operation as well as to additional objects and advantages, will best be understood from the following description when read in connection with the accompanying drawings, in which the single figure is a circuit diagram of a signal translation system in which there is incorporated an AGC system in accordance with the present invention.

Briefly speaking, the present invention provides an AGC system for a tuned signal translation system which translation system gets its band-pass characteristic by reason of at least two parallel electrical paths in which at least one path has an active gain device, such as a transistor, that provides a positive gain, preferably greater than unity and provides a phase reversal for all signals passing through the device, in combination with a passive phase shifting means to provide substantially a 360° phase shift of signals of selected frequency bands as they travel from the input to the output of the active path. The active device is voltage sensitive and its DC operating level varies with the amplitude of the input signals. The passive device, in the form of an RC netwrok is voltage and frequency sensitive and since it is connected to the active device, variations of input signals have a tendency to detune it. The present invention provides means for applying an AGC voltage to the passive device to prevent it from detuning while at the same time applying a correction voltage to the variable gain device at the output of the system to maintain a substantially constant output.

The other path is passive and serves as a coupling between the output and input for the purpose of reinforcing signals in the selected band of frequencies. In the two embodiments illustrated, there is an output summing resistor, at least a portion of which is between the junction of the path with the common grounded output terminal. In the first embodiment, the output is taken directly from the voltage drop across the summing resistor while in the other embodiment the voltage drop across the summing resistor is fed to a combined isolation and gain control output transistor from which the output is taken.

In both the embodiments the value of the summing resistor is so related to the input impedance that regenerative feedback is supplied through the passive path to produce reinforcement of the selected band of frequencies at input of the system.

However, as far as the basic inventive concept of the present invention is concerned the second path containing the passive device could be adjusted relative to the output impedance in such a manner that the input impedance is less than that portion of the output impedance included in the second circuit so that all signals are fed forward from the input through the system and reinforcement takes place at the output of the system.

Referring to FIG. 1, two parallel paths are shown, one active and the other passive, the active path including an active device, such as a transistor 10, having a gain greater than unity, in combination with a filter network in the form of a distributed resistance-capacitance 21. Preferably, this distributed RC network is a PN junction device of conventional construction. The transistor 10 is connected as a grounded emitter and has base 11 constituting the input to the system, a collector 12 and an emitter 13 which is connected to ground 14. The collector 12 is connected through a dropping resistor 16 and a series current-controlling transistor 17 to a source of DC potential represented by the terminal 18. The transistors 10 and 17 are of similar types and have the same operating characteristics.

They are illustrated as being of the PNP type. If desired, another suitable dropping resistor can be connected from the upper end of the resistor 16 to the base of transistor 10 to supply the appropriate biasing voltage The input end of the distributed RC network 21 is connected to the collector 12 of the transistor 10 and the output end of the network is connected through conductor 26 to the upper end of suitable potential divider 27, the lower end of which is connected to ground 14. The output from this system is between the terminal 28, connected between the output end of the RC network 21 and the upper end of the potentiometer 27. The other output terminal 29 is connected to ground 14. The passive path between the input terminal 31 and the output terminal 28 is made up of the conductors 32, 33 and a suitable capacitor 34. The conductor 33 is connected to the slider arm 36 on the voltage divider 37 which may be considered to include two portions R1 and R2 jointed at the position of the contact 36. The active path of this signal translation system from the input terminal 31 to the output terminal 28 is through the base-collector junction of the transistor 10 and the distributed RC phase shifting network 21 to the output terminal 28, while the passive path is through the conductor 32, 33 capacitor 34 the arm 36 of the potential divider and the upper portion of the potential divider 27 to the output terminal 28. The resistance-capacitance network 21 has a frequency-sensitive transfer characteristic. The amount of phase shift of the signals during their passage from the input to the output terminal is a function of frequency. The phase of all input frequencies, appearing at the base-collector junction of the transistor 10 is inverted. In addition to this, there is an "excess phase shift" due to the equivalent distributed RC network of the base-collector junction. This "excess phase shift" is a function of frequency. The parameters of the equivalent distributed RC network device 21 are so chosen in relation to the other parameters of the active path that for a selected band of frequencies there will occur a total phase shift of 360° between the input and output terminals.

The impedance of the base-emitter circuit of the transistor is low and the position of the contact arm 36 on the potential divider 27 can be so adjusted that the input impedance is less or greater than the impedance between the arm 36 and the ground. If the input impedance is greater than the impedance between the arm 36 and ground regenerative feedback at the selected band of frequencies takes place. Under this condition the amplitude vectors of the selected frequency band are summed in the summing resistor 27, which also serves as the voltage divider, and therefore reinforcement takes place in the input circuit and the amplified resultant appears as a voltage drop across the output terminals 28 and 29. Where the reverse is true there will be a direct "feed-through" of signals from the input to the output where the amplified vectors of the selected frequencies will be summed in the resistor 27 and reinforcement takes place in the output circuit.

Under the latter condition the system is completely stable and no oscillating condition can occur. However, when the point of coupling of the arm 36 on the resistor 27 is such that regenerative feedback takes place, the amount of regeneration can be made such that the system will oscillate.

By applying a suitable back-biasing voltage on this type of distributed RC network the capacitance can be changed readily and therefore the parameters of the distributed RC change which results in a shifting of tuning of such device. The shift of the tuning is effected for the well-known reason that when the signal level changes the DC operating point changes and this in turn changes the reverse bias on the PN junction. This in turn shifts the center frequency of the pass-band. In order to vary the loop gain within the voltage tuned amplifier and still prevent the effect of the voltage producing this change of gain from adversely affecting the tuning, or shifting of the center frequency of the distributed RC network 21, an AGC amplifier transistor 41 has its base 42 connected to a source of AGC voltage symbolized by the terminal 43. The transistor 41 controls the potential drop across resistor 49 and is complementary to the transistor 17 whose base 44 is also connected to the AGC voltage source 43. The emitter 46 of the transistor 17 is connected through a suitable conductor 47 to the capacitive region 48 of the network 21 and the resistor 49. The collector 50 of the transistor 41 is connected to the negative terminal of a suitable DC source represented by the terminal 51. Although not shown in the drawing, it is to be understood that in accordance with conventional practice in this system there will be an appropriate AGC rectifier and filter connected to the source of input signals for generating the AGC voltage.

In the operation of the invention the loop gain within the timed amplifier is varied while simultaneously the AGC voltage is applied to the filter network PN junction device 21 so that the shift in the pole position due to the changing gain of the amplifying portion of the system is compensated by the shift in the RC product of the filter. When an AGC voltage is supplied to the terminal 43, the change in voltage across the resistor 49 applied to the capacitive region 48 of the PN junction device 21 is in a direction and amount to substantially follow the change in voltage drop across the resistor 16 in response to the AGC voltage applied to the base of the transistor 17.

Summarizing the operation of the present invention, all of the components of the input signal applied to the input terminal 31 will be applied directly to the base 11 of the transistor 10 and through the passive electrical path, including the capacitor 34, will be supplied to the summing resistor 27. Since the transistor 10 is connected as a grounded emitter all of the input signal components will be inverted at its collector output which is the input to the distributed RC network PN junction device 21. In addition thereto, there will be a certain amount of selective excess phase shift of a band of signals due to the equivalent distributed RC network inherent in the transistor 10. The parameters of the device 21 are so chosen that for the normal bias voltage on the PN junction device 21 there will be a further shift in the phase of the signal vectors in the selected band of frequencies over and above the 180° phase shift in transistor 10 due to its grounded emitter circuit configuration to give a 360° phase shift for the selected band of frequencies between the input and output terminals. Since it is to be assumed that the slider 36 will be so adjusted that for this desired frequency band there will be a regenerative feedback from the summing resistor 27 through the capacitor 34 to the base of the transistor 10, there will be selective reinforcement and enhancement of the selected frequency band.

Now assume that the signal level at the output terminals 28 and 29 tends to increase above the desired level for which the system is adjusted and that a negative-going AGC voltage is therefore applied to the AGC input terminal 43. The beta of the system will then be decreased by reason of the fact that the negative-going AGC signal applied to the base 44 of the PNP type AGC amplifying transistor 17 will decrease the current flowing through the collector-emitter circuit including the resistor 16, the resistive portion of the distributor RC network 21 and the summing resistor 27. This moves the voltage on the collector 12 of the transistor 10 toward ground at the same time that the gain is decreased. The distributed resistance region of the device 21 moves toward ground with the voltage on the collector 12 of transistor 10.

Simultaneously with the increasing negative-going AGC voltage appearing on the base 44 of the PNP type transistor 17 is applied to the base 42 of the complementary NPN type transistor 41. As the negative-going AGC voltage applied to the base of the transistor 17 causes its collector current to increase, therefore reducing toward ground the voltage on the collector 12 of transistor 10 and on the input to the device 21, the same AGC voltage applied to the base of the NPN type transistor 41 causes the current through its collector-emitter circuit and the resistor 49 to decrease thus causing the potential on the capacitive region 48 of the PN junction device 21 to become more positive. Thus, the gain of the transistor 10 is decreased without the correcting AGC voltage causing a shift in the center frequency of the selected pass-band. It follows that a decrease in the signal input causes a reduction in the AGC voltage and opposite change in the voltages on the two regions of the device 21 so that the potential difference across the PN junction remains constant as before.

What is claimed is:

1. A band-pass signal translation system comprising an input terminal, an output terminal, a common input-output terminal, at least two paths between said input and said output terminals, one of said paths including a transistor connected in a grounded emitter configuration and a passive voltage responsive phase shifting distributed RC network, a source of AGC voltage which is a function of the signals applied to the input, and means responsive to said AGC voltage for simultaneously varying the gain of said transistor and shifting the RC product of said network so that the center frequency of the band-pass is not changed in response to variations in the amplitude of the input signals.

2. A band-pass signal translation system as set forth in claim 1 wherein said means responsive to the AGC voltage is a pair of complementary transistors, one of which controls the current to said grounded emitter-transistor and the other controls the voltage on said distributed RC network.

3. A band-pass signal translation system as set forth in claim 1 wherein said distributed RC network is a back biased PN junction device.

4. The band-pass signal translation system as set forth in claim 1 wherein said passive voltage responsive phase shifting distributed RC network is a back bias PN junction and wherein said means responsive to said AGC voltage is a pair of complementary transistors one of which controls the current to said ground emitter-transistor and the other controls the voltage across said PN junction.

No references cited.

JOHN KOMINSKI, *Primary Examiner.*